United States Patent
Kokubun et al.

(10) Patent No.: US 11,508,856 B2
(45) Date of Patent: Nov. 22, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Koichi Kokubun, Yokohama Kanagawa (JP); Mitsuhiro Sengoku, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/187,369

(22) Filed: Feb. 26, 2021

(65) Prior Publication Data

US 2022/0069142 A1    Mar. 3, 2022

(30) Foreign Application Priority Data

Aug. 28, 2020    (JP) .............................. JP2020-144602

(51) Int. Cl.
*H01L 31/02*    (2006.01)
*H01L 31/10*    (2006.01)
(Continued)

(52) U.S. Cl.
CPC .... *H01L 31/02005* (2013.01); *H01L 27/1446* (2013.01); *H01L 31/0256* (2013.01); *H01L 31/10* (2013.01)

(58) Field of Classification Search
CPC ........... H01L 31/02005; H01L 31/0256; H01L 31/10; H01L 27/1446
See application file for complete search history.

(56) References Cited

U.S. PATENT DOCUMENTS 6,225,670 B1 *   5/2001   Dierickx ........... H01L 27/14643
                                                            257/431
7,262,402 B2 *   8/2007   Niclass ............. H01L 27/14647
                                                            250/208.1
(Continued)

FOREIGN PATENT DOCUMENTS

EP    3611535 A1 *   2/2020   ............. G01S 7/497
GB    2509545 A  *   7/2014   ............. G01T 1/248
(Continued)

*Primary Examiner* — Sitaramarao S Yechuri (74) *Attorney, Agent, or Firm* — Kim & Stewart LLP (57) ABSTRACT

A semiconductor device includes a photosensitive element, an insulating region, and a quench element. The photosensitive element includes a first semiconductor region of a first conductivity type, a second semiconductor region of the first conductivity type on the first semiconductor region, a third semiconductor region of a second conductivity type on the second semiconductor region, and a fourth semiconductor region of the second conductivity type around the second and third semiconductor regions. An impurity concentration of the first conductivity type in the second semiconductor region is higher than that in the first semiconductor region. An impurity concentration of the second conductivity type in the fourth semiconductor region is lower than that of the third semiconductor region. The insulating region is around the first and fourth semiconductor regions. The quench element is electrically connected to the third semiconductor region.

20 Claims, 7 Drawing Sheets

(51) Int. Cl.
*H01L 31/0256* (2006.01)
*H01L 27/144* (2006.01)

(56) References Cited

U.S. PATENT DOCUMENTS

| | | | |
|---|---|---|---|
| 7,759,650 B2 | 7/2010 | Heringa et al. | |
| 2006/0192086 A1* | 8/2006 | Niclass | H01L 31/107 |
| | | | 250/214.1 |
| 2008/0203309 A1* | 8/2008 | Frach | G01T 1/1642 |
| | | | 250/362 |
| 2010/0079168 A1 | 4/2010 | Tashiro | |
| 2011/0272561 A1* | 11/2011 | Sanfilippo | H01L 31/107 |
| | | | 250/214.1 |
| 2015/0333095 A1* | 11/2015 | Fallica | H01L 27/14643 |
| | | | 250/208.1 |

FOREIGN PATENT DOCUMENTS

| | | | | |
|---|---|---|---|---|
| JP | 2007-141937 A | 6/2007 | | |
| JP | 5437791 B2 | 3/2014 | | |
| JP | 2015-084392 A | 4/2015 | | |
| WO | WO-2020170841 A1 * | 8/2020 | | G01S 17/08 |

* cited by examiner

SEMICONDUCTOR DEVICE

CROSS-REFERENCE TO RELATED APPLICATION

This application is based upon and claims the benefit of priority from Japanese Patent Application No. 2020-144602, filed Aug. 28, 2020, the entire contents of which are incorporated herein by reference.

FIELD

Embodiments described herein relate generally to a semiconductor device.

BACKGROUND

Some semiconductor devices detect light. Desirably, such semiconductor devices operate more stably.

DETAILED DESCRIPTION

Embodiments provide a semiconductor device operable more stably.

In general, according to an embodiment, a semiconductor device includes a photosensitive element, an insulating region, and a quench element. The photosensitive element includes a first semiconductor region of a first conductivity type, a second semiconductor region of the first conductivity type on the first semiconductor region, a third semiconductor region of a second conductivity type on the second semiconductor region, and a fourth semiconductor region of the second conductivity type around the second and third semiconductor regions. An impurity concentration of the first conductivity type in the second semiconductor region is higher than that in the first semiconductor region. An impurity concentration of the second conductivity type in the fourth semiconductor region is lower than that of the third semiconductor region. The insulating region is around the first and fourth semiconductor regions. The quench element is electrically connected to the third semiconductor region.

Hereinafter, certain example embodiments of the present disclosure will be described with reference to the drawings.

The drawings are schematic or conceptual diagrams where relationships between thickness and width of components and ratios between sizes of components, for example, are not necessarily the same as actual components. Even in the case of illustrating an identical component, the component may have variable sizes and ratios in different drawings.

In the specification of the disclosure and the accompanying drawings, the same components as already described are denoted by identical reference numerals and signs and will not be repeatedly elaborated unless occasion demands.

In the following description and the drawings, signs $n^+$, n, $p^+$, p, and $p^-$ represent relative levels of impurity concentrations. Specifically, a sign with "+" represents an impurity concentration relatively higher than signs with neither of "+" and "−", and a sign with "−" represents an impurity concentration relatively lower than the signs with neither of "+" and "−". When each region includes both of a p-type impurity and an n-type impurity, these signs represent levels of net impurity concentrations after the impurities compensate for each other.

The following embodiments may be implemented by inverting the p-type and the n-type in each semiconductor region.

First Embodiment

Figure 1:
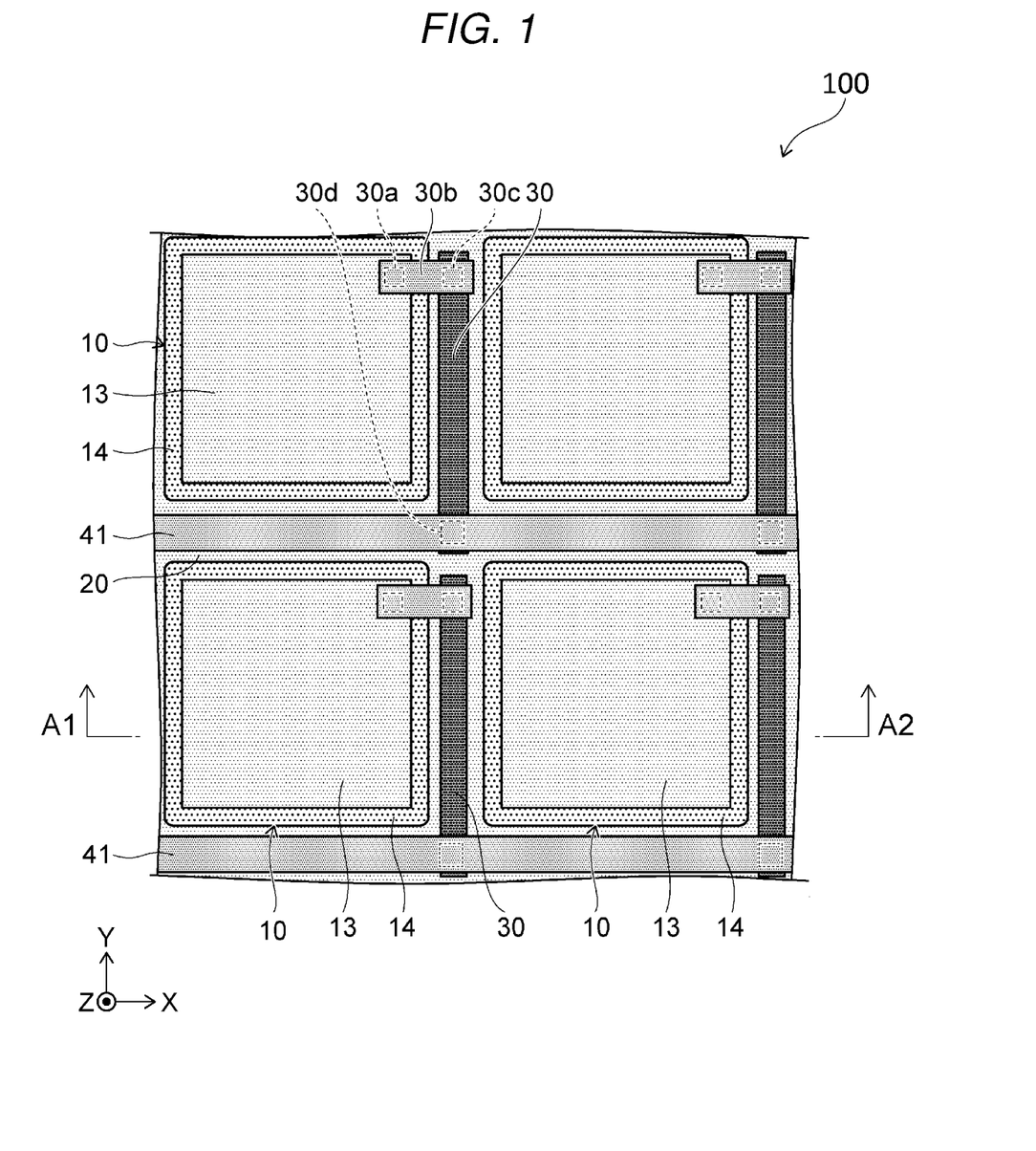
FIG. 1 illustrates a schematic plan view of a semiconductor device according to a first embodiment.
Figure 2:
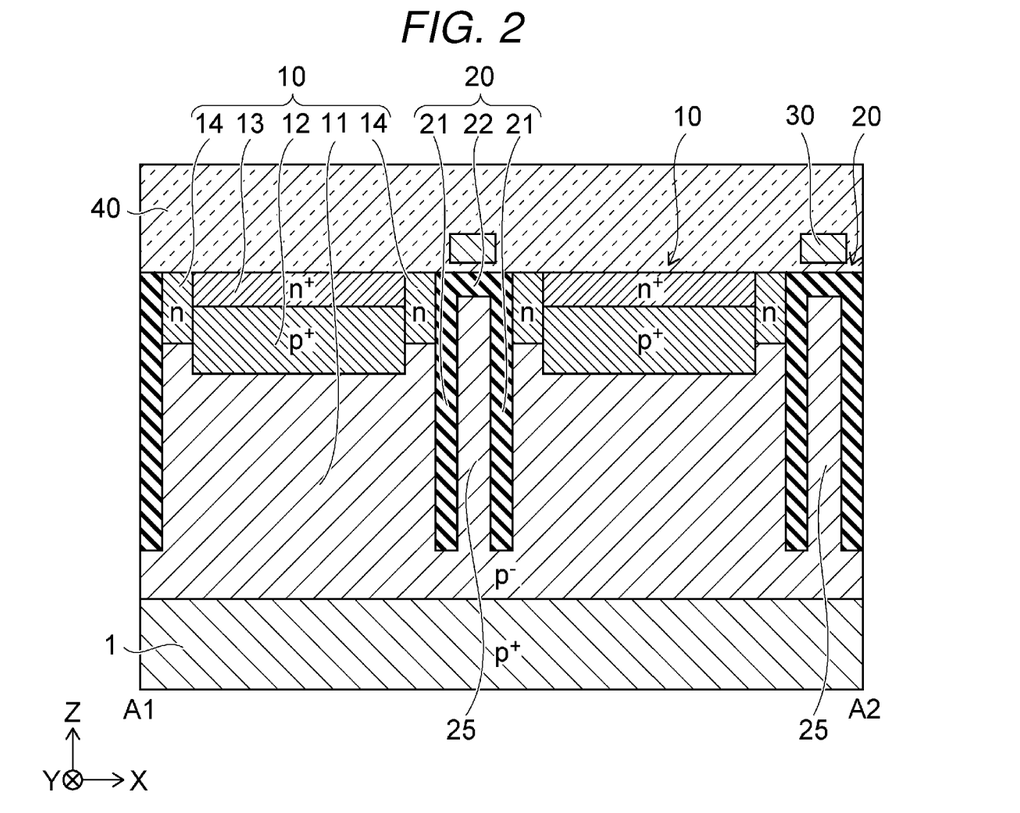
FIG. 2 illustrates a cross-sectional view of the semiconductor device taken along line A1-A2 in FIG. 1.

FIG. 1 illustrates a schematic plan view of a semiconductor device according to a first embodiment. FIG. 2 illustrates a cross-sectional view of the semiconductor device taken along line A1-A2 in FIG. 1.

As illustrated in FIG. 1 and FIG. 2, a semiconductor device 100 according to the first embodiment includes a conductive layer 1, an element portion 10, an insulating portion 20, a quench portion 30, an insulating layer 40, and wiring 41. In FIG. 1, the insulating layer 40 is omitted. Contact plugs are indicated by dashed lines.

As illustrated in FIG. 2, the element portion 10 includes a $p^-$-type semiconductor region 11, a $p^+$-type semiconductor region 12, an $n^+$-type semiconductor region 13, and an n-type semiconductor region 14.

In this description, a direction from the $p^-$-type semiconductor region 11 toward the $p^+$-type semiconductor region 12 will be referred to as Z-direction. Two directions orthogonal to the Z-direction and perpendicular to each other will be referred to as X-direction and Y-direction. For convenience sake, a direction from the $p^-$-type semiconductor region 11 toward the $p^+$-type semiconductor region 12 will be referred to as "upward" or the like, and its reverse direction will be referred to as "downward" or the like. These directions are based on positional relationships of the $p^-$-type semiconductor region 11 and the $p^+$-type semiconductor region 12 relative to each other and have no relation with a gravitational direction.

The $p^+$-type semiconductor region 12 is disposed on the $p^-$-type semiconductor region 11. A p-type impurity concentration in the $p^+$-type semiconductor region 12 is higher than a p-type impurity concentration in the $p^-$-type semiconductor region 11. The $n^+$-type semiconductor region 13 is disposed on the $p^+$-type semiconductor region 12 and in contact with the $p^+$-type semiconductor region 12. A p-n junction is formed between the $p^+$-type semiconductor region 12 and the $n^+$-type semiconductor region 13. For example, a p-n junction plane extends along an X-Y plane (the first plane) orthogonal to the Z-direction. The n-type semiconductor region 14 extends along the X-Y plane and is disposed around the $p^+$-type semiconductor region 12 and the $n^+$-type semiconductor region 13.

The insulating portion 20 extends along the X-Y plane and is disposed around the element portion 10. The insulating portion 20 includes a first insulating region 21. A lower end of the first insulating region 21 is located at a lower level than a lower end of the p⁺-type semiconductor region 12. For example, the first insulating region 21 extends to a lower level than a depletion layer spread in the p⁻-type semiconductor region 11.

The insulation portion 20 may further include a second insulating region 22. The second insulating region 22 is disposed on the first insulating region 21 and extends along the X-Y plane. For example, the second insulating region 22 and the n⁺-type semiconductor region 13 are side by side in the X-direction and in the Y-direction.

A plurality of the element portions 10 are aligned in the X-direction and in the Y-direction. A plurality of the first insulating regions 21 extend along the X-Y plane and are respectively provided around the plurality of element portions 10. The single second insulating region 22 is provided on the plurality of first insulating regions 21. That is, all of the first insulating regions 21 are in contact with the single second insulating region 22 in common. Each element portion 10 can serve as a photosensitive element, and the semiconductor device 100 including an array of the element portions 10 can serve as a photo sensor.

The plurality of first insulating regions 21 are apart from one another. A semiconductor region 25 is between each adjacent pair of the first insulating regions 21 in the X-direction or the Y-direction. A p-type impurity concentration in the semiconductor region 25 may be equal to or different from the p-type impurity concentration in the p⁻-type semiconductor region 11.

The plurality of element portions 10 and the plurality of insulating portions 20 are disposed on the conductive layer 1. Each of the p⁻-type semiconductor regions 11 is electrically connected to the conductive layer 1. For example, a lower end of each of the first insulating regions 21 is apart from the conductive layer 1 in the Z-direction.

The quench portion 30 is at a higher level than each of the element portions 10 and electrically connected to the n⁺-type semiconductor region 13. For example, as illustrated in FIG. 1, the n⁺-type semiconductor region 13 is electrically connected to the wiring 41 via a contact plug 30a, wiring 30b, a contact plug 30c, the quench portion 30, and a contact plug 30d. Preferably, the quench portion 30 is disposed above each of the insulating portions 20. This prevents light approaching the element portion 10 from being blocked by the quench portion 30. The quench portion 30 may be referred to as a quench element.

The insulating layer 40 is disposed on the element portions 10 and the insulating portions 20. The contact plugs, the wiring, and the quench portions 30 described above are disposed in the insulating layer 40. The insulating layer 40 may include a plurality of insulating films stacked in the Z-direction.

Operation of the semiconductor device 100 will be described.

When light enters the element portion 10, an electric charge is generated in the element portion 10. For example, a reverse voltage in excess of a breakdown voltage is applied between the p⁺-type semiconductor region 12 and the n⁺-type semiconductor region 13, and the element portion 10 operates in Geiger mode. The electric charge generated in the element portion 10 causes a breakdown, and a large amount of electric charge is generated. The electric charge flows to the wiring 41 via the n⁺-type semiconductor region 13 and the quench portion 30 and is taken out of the semiconductor device 100.

An electric resistance of the quench portion 30 is higher than an electric resistance of each of the contact plugs 30a, 30c, and 30d, and the wiring 30b. Preferably, the electric resistance of the quench portion 30 is higher than 10 kΩ and lower than 10 MΩ. The quench portion 30 is provided to prevent an avalanche breakdown from continuing when light enters the element portion 10 to cause the avalanche breakdown. Upon occurrence of the avalanche breakdown, when a current flows to the quench portion 30, a voltage decrease occurs in accordance with the electric resistance of the quench portion 30. Due to the voltage decrease, a potential difference between the p⁺-type semiconductor region 12 and the n⁺-type semiconductor region 13 is decreased to stop the avalanche breakdown. This makes it possible to detect light (e.g., a next photon) that enters the element portion 10 thereafter.

As described above, a resistor to cause a large voltage decrease may be provided as the quench portion 30. Instead of the resistor, the quench portion 30 including a transistor to which an active quench mode is applied may be provided.

Examples of materials of the components will be described.

The p⁻-type semiconductor regions 11, the p⁺-type semiconductor regions 12, the n⁺-type semiconductor regions 13, and the n-type semiconductor regions 14 include semiconductor materials such as silicon, silicon carbide, gallium arsenide, and gallium nitride. When silicon is used as a semiconductor material, phosphorus, arsenic, or antimony is used as an n-type impurity. Boron is used as a p-type impurity.

The conductive layer 1 is a p⁺-type semiconductor layer. The conductive layer 1 includes the above-described semiconductor materials. A p-type impurity concentration in the conductive layer 1 is higher than the p-type impurity concentration in the p⁻-type semiconductor region 11. The conductive layer 1 may include a metal. For example, the conductive layer 1 includes at least one selected from the group consisting of aluminum, copper, titanium, gold, and nickel.

The insulating portions 20 and the insulating layer 40 comprise insulating materials. In order to reduce crosstalk between the element portions 10, a refractive index of an insulating material of the insulating portions 20 is preferably lower than a refractive index of a semiconductor material of the element portions 10. For example, the insulating portions 20 and the insulating layer 40 include silicon oxide.

The quench portions 30 as the resistors comprise polysilicon. An n-type impurity or a p-type impurity may be added to the quench portions 30. The contact plugs and the wiring comprise a metal. The metal is at least one selected from the group consisting of titanium, tungsten, copper, and aluminum.

Effects of the first embodiment will be described.

Figure 3:
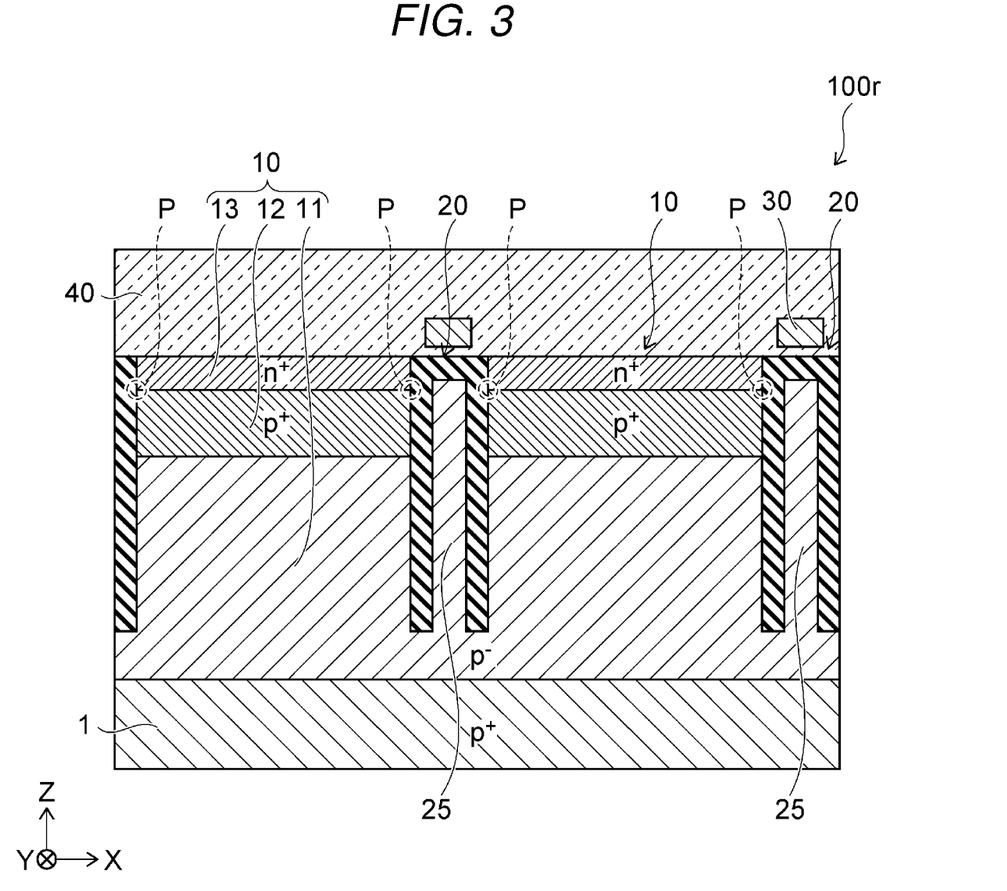
FIG. 3 illustrates a cross-sectional view of a semiconductor device according to a reference example.

FIG. 3 illustrates a cross-sectional view of a semiconductor device according to a reference example.

In a semiconductor device 100r according to the reference example, the element portions 10 are not provided with the n-type semiconductor regions 14. The p⁺-type semiconductor regions 12 and the n⁺-type semiconductor regions 13 are in contact with the insulating portions 20.

In the semiconductor device 100r, an electric field strength increases at an outer-peripheral lower portion P of each of the n⁺-type semiconductor regions 13. Consequently, an avalanche breakdown is more likely to occur in the vicinity of the portion P than in other portions. For example, in the vicinity of the portion P, edge breakdown is more likely to occur earlier than in other portions. Moreover, in the vicinity of the portion P, there is a possibility of an unintentional breakdown occurring to increase noise.

In the semiconductor device 100 according to the first embodiment, the element portions 10 include the n-type semiconductor regions 14. Each of the n-type semiconductor regions 14 extends along the X-Y plane and is provided around the p$^+$-type semiconductor region 12 and the n$^+$-type semiconductor region 13. With the n-type semiconductor region 14, an electric field strength at an outer-peripheral lower portion of the n$^+$-type semiconductor region 13 can be decreased. Moreover, an electric field strength in the n-type semiconductor region 14 is made lower than the electric field strength at the portion P of the semiconductor device 100r. This can prevent a local increase of electric field strength in the element portion 10. Thus, for example, occurrence of an edge breakdown can be prevented to make the operation of the semiconductor device 100 more stable. Furthermore, the noise of the semiconductor device 100 can be reduced.

Preferably, a lower end of the n-type semiconductor region 14 is located at a higher level than the lower end of the p$^+$-type semiconductor region 12. When the lower end of the n-type semiconductor region 14 is located at a lower level than the lower end of the p$^+$-type semiconductor region 12, carriers generated upon a breakdown are apt to flow into the n-type semiconductor region 14. When the carriers flow into the n-type semiconductor region 14, signals flowing through the wiring 41 become smaller than when carriers flow into the n$^+$-type semiconductor region 13. The n-type semiconductor region 14 is substantially a blind area. The lower end of the n-type semiconductor region 14 is located at a higher level than the lower end of the p$^+$-type semiconductor region 12 so that the number of the carriers that flow into the n-type semiconductor region 14 can be decreased to improve sensitivity of the semiconductor device 100 with respect to light.

For example, a position of the lower end of the p$^+$-type semiconductor region 12 is specified by the following method. A p-type impurity concentration (the first concentration) of the p$^+$-type semiconductor region 12 in the vicinity of the p-n junction plane is measured. A p-type impurity concentration (the second concentration) in the p$^-$-type semiconductor region 11 at a position apart from the p$^+$-type semiconductor region 12 in the Z-direction is measured. Between the p$^-$-type semiconductor region 11 and the p$^+$-type semiconductor region 12, a position where a p-type impurity concentration has an intermediate value between the first concentration and the second concentration is specified. The position corresponds to the position of the lower end of the p$^+$-type semiconductor region 12.

Second Embodiment

Figure 4:
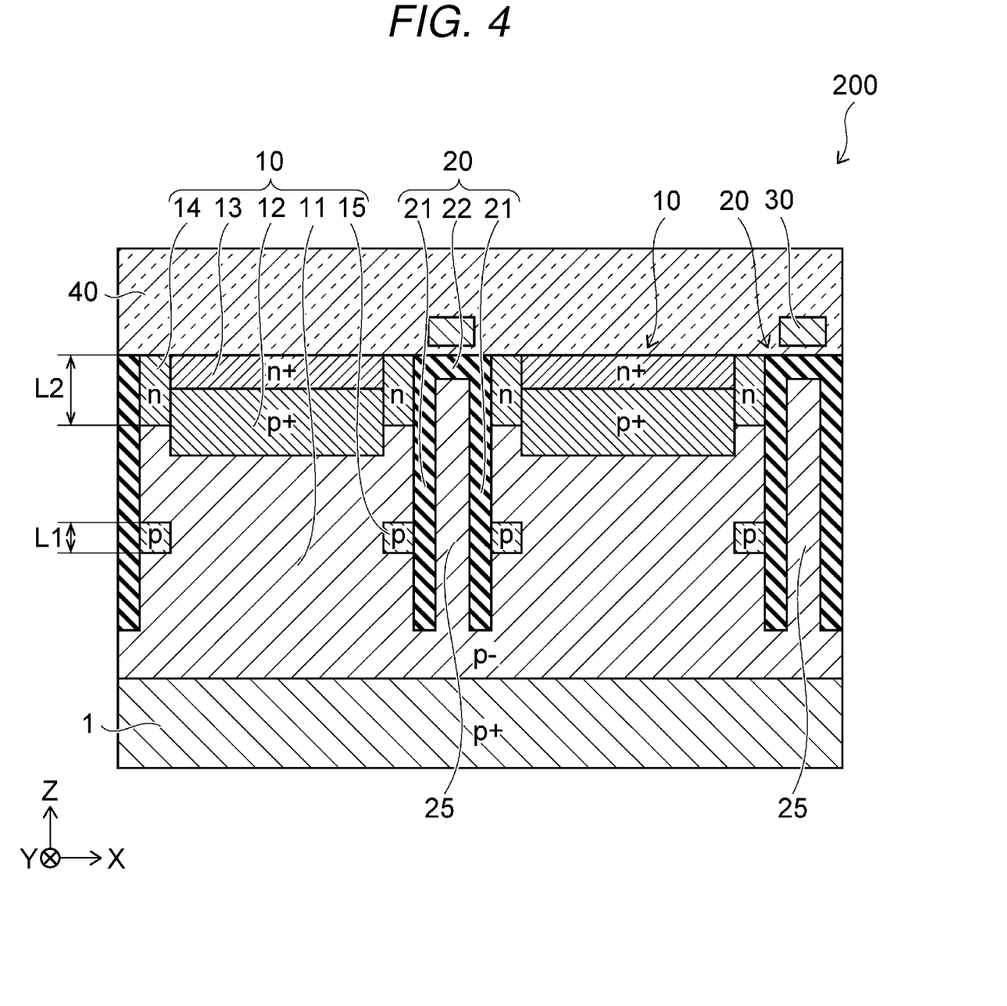
FIG. 4 illustrates a cross-sectional view of a semiconductor device according to a second embodiment.

FIG. 4 illustrates a cross-sectional view of a semiconductor device according to a second embodiment.

A semiconductor device 200 according to the second embodiment differs from the semiconductor device 100 in that each of the element portions 10 further includes a p-type semiconductor region 15 (the fifth semiconductor region).

The p-type semiconductor region 15 is below the n-type semiconductor region 14. For example, the p-type semiconductor region 15 is in contact with the insulating portion 20 (or the first insulating region 21). A p-type impurity concentration in the p-type semiconductor region 15 is higher than the p-type impurity concentration in the p$^-$-type semiconductor region 11 and lower than the p-type impurity concentration in the p$^+$-type semiconductor region 12.

Figure 5:
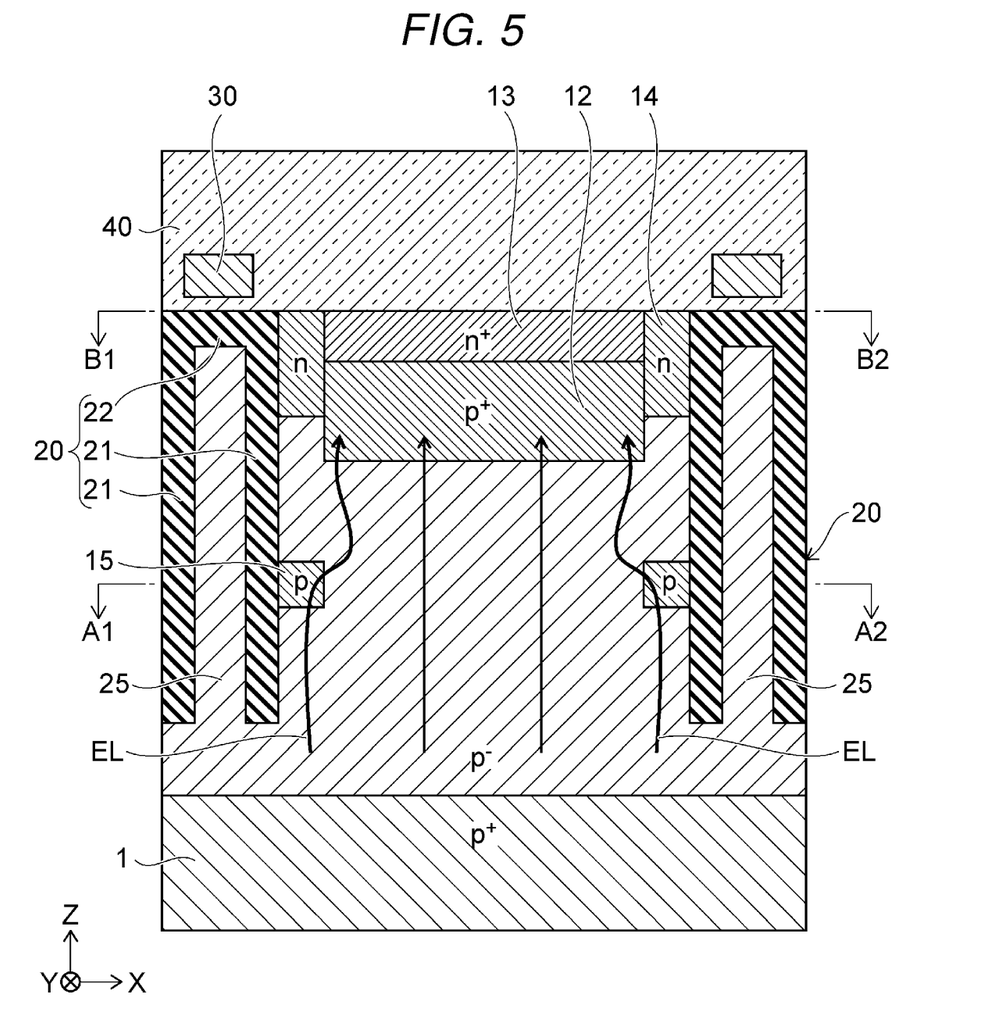
FIG. 5 is a schematic diagram illustrating electric flux lines when a voltage is applied to the semiconductor device according to the second embodiment.

FIG. 5 is a schematic diagram illustrating lines of electric flux when a voltage is applied to the semiconductor device 200 according to the second embodiment.

As described above, when the number of carriers that flow into the n-type semiconductor region 14 is reduced, sensitivity to light is improved. In the semiconductor device 200, as illustrated in FIG. 5, electric flux lines EL can be turned to an inner side of the element portion 10 at the p-type semiconductor region 15. This can prevent carriers from flowing into the n-type semiconductor region 14 and facilitate flowing of carriers into the p$^+$-type semiconductor region 12. According to the second embodiment, as compared with the first embodiment, photosensitivity of the semiconductor device 200 can be improved.

Preferably, the p-type semiconductor region 15 is separate from the n-type semiconductor region 14 in the Z-direction. As the p-type semiconductor region 15 is located at a lower level, the electric flux lines EL can be turned inward at a position more separate from the n-type semiconductor region 14. This can further prevent carriers from flowing into the n-type semiconductor region 14.

The p-type impurity concentration in the p-type semiconductor region 15 is higher than the p-type impurity concentration in the p$^-$-type semiconductor region 11. A carrier lifetime in the p-type semiconductor region 15 is shorter than a carrier lifetime in the p$^-$-type semiconductor region 11. When a length L1 of the p-type semiconductor region 15 in the Z-direction indicated in FIG. 4 is excessively large, carriers generated in the element portion 10 are more likely to disappear. That is, an effective light receiving area is decreased. In view of this, the length L1 is preferably less than, for example, a length L2 of the n-type semiconductor region 14 in the Z-direction. Thus, photosensitivity can be improved while the effective light receiving area can be prevented from decreasing.

For example, a boundary between the p$^-$-type semiconductor region 11 and the p-type semiconductor region 15 is specified by the following method. A maximum p-type impurity concentration (the first concentration) in the p-type semiconductor region 15 is measured. A p-type impurity concentration (the second concentration) in the p$^-$-type semiconductor region 11 at a position apart from the p-type semiconductor region 15 is measured. Between the p$^-$-type semiconductor region 11 and the p-type semiconductor region 15, a position where a p-type impurity concentration has an intermediate value between the first concentration and the second concentration is specified. The position corresponds to the boundary between the p$^-$-type semiconductor region 11 and the p-type semiconductor region 15.

Figure 6A:
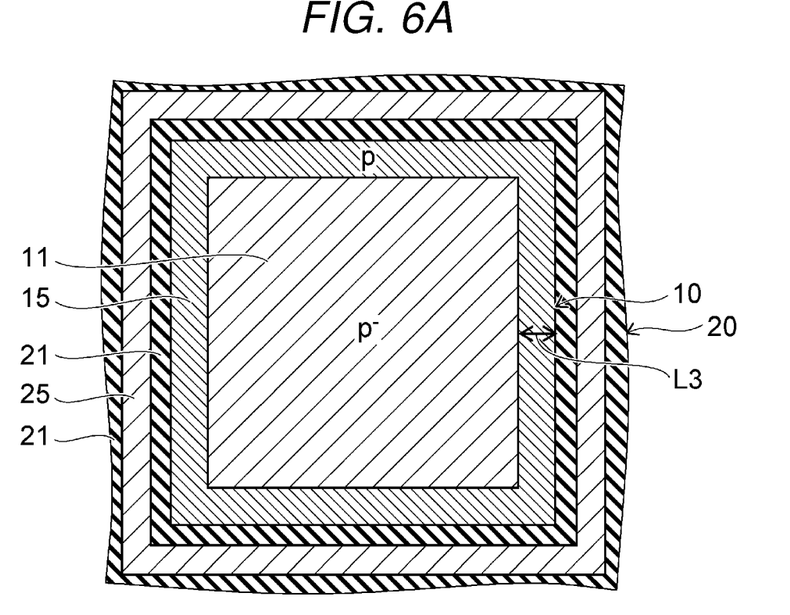
FIG. 6A illustrates a cross-sectional view of the semiconductor device taken along line A1-A2 in FIG. 5.
Figure 6B:
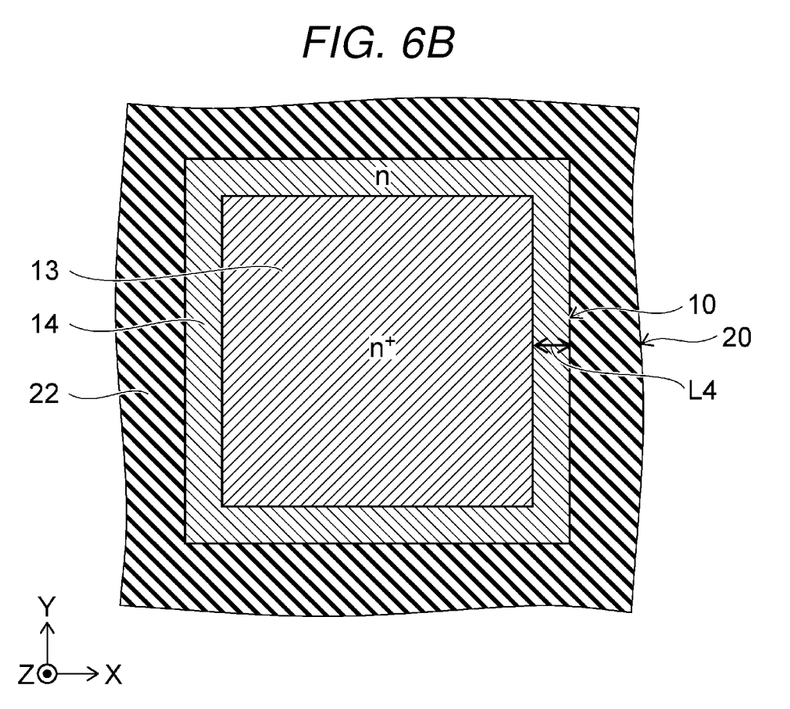
FIG. 6B illustrates a cross-sectional view of the semiconductor device taken along line B1-B2 in FIG. 5.

FIG. 6A illustrates a cross-sectional view of the semiconductor device taken along line A1-A2 in FIG. 5. FIG. 6B illustrates a cross-sectional view of the semiconductor device taken along line B1-B2 in FIG. 5.

Preferably, a length L3 of the p-type semiconductor region 15 indicated in FIG. 6A is more than 0.8 times and less than 1.2 times larger than a length L4 of the n-type semiconductor region 14 indicated in FIG. 6B. The lengths L3 and L4 are respectively a length of the p-type semiconductor region 15 and a length of the n-type semiconductor region 14 in a direction from the element portion 10 toward the insulating portion 20. When the length L3 is less than 0.8 times larger than the length L4, an effect of preventing carriers from flowing into the n-type semiconductor region 14 is lessened. When the length L3 is more than 1.2 times larger than the length L4, the effect of preventing carriers from flowing into the n-type semiconductor region 14 is substantially unchanged, and a capacity of the p-type semiconductor region 15 increases. The length L3 is more than 0.8 times and less than 1.2 times larger than the length L4 so that flowing of carriers into the n-type semiconductor region 14 can be effectively prevented while an increase in the capacity of the p-type semiconductor region 15 can be minimized.

For example, a boundary between the n+-type semiconductor region 13 and the n-type semiconductor region 14 is specified by the following method. A maximum n-type impurity concentration (referred to as the first concentration) in the n+-type semiconductor region 13 is measured. A minimum n-type impurity concentration (referred to as the second concentration) of the n-type semiconductor region 14 in the vicinity of the insulating portion 20 is measured. Between the n+-type semiconductor region 13 and the n-type semiconductor region 14, a position where an n-type impurity concentration has an intermediate value between the first concentration and the second concentration is specified. This position corresponds to the boundary between the n+-type semiconductor region 13 and the n-type semiconductor region 14.

In one example, a depth of the p-n junction plane between the p+-type semiconductor region 12 and the n+-type semiconductor region 13 is larger than 0.5 µm and less than 1 µm. A depth of the lower end of the p+-type semiconductor region 12 is larger than 0.8 µm and less than 1.6 µm. A depth of the lower end of the n-type semiconductor region 14 is larger than 0.8 µm and less than 1.2 µm. A depth of a lower end of the p-type semiconductor region 15 is larger than 2.5 µm and less than 4 µm. A depth corresponds to a distance from an upper surface of the element portion 10 in the Z-direction.

Third Embodiment

Figure 7:
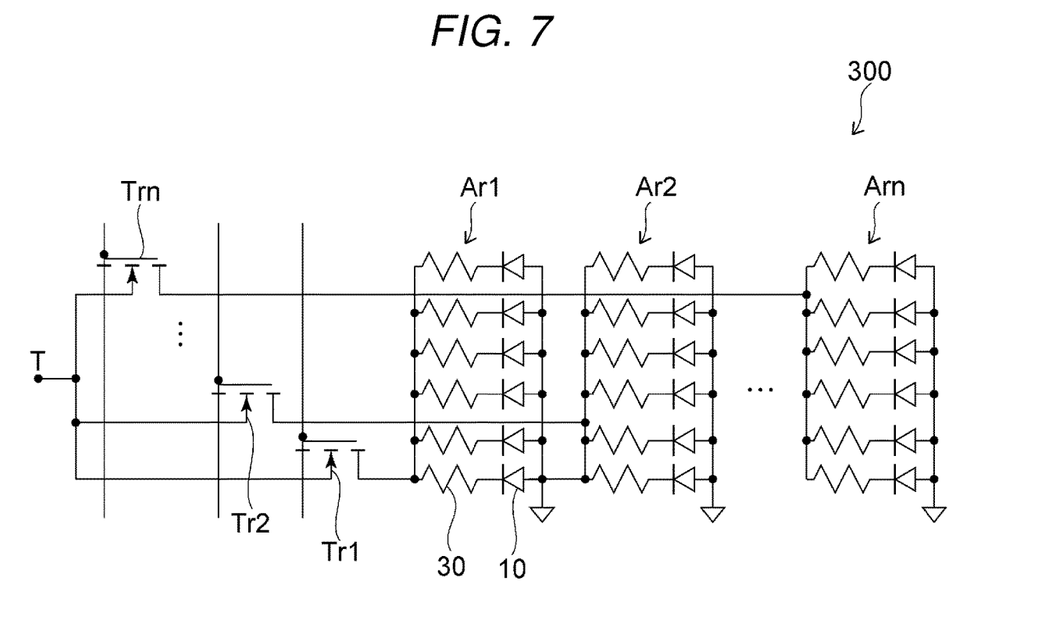
FIG. 7 is a circuit diagram illustrating a semiconductor device according to a third embodiment.

FIG. 7 is a circuit diagram illustrating a semiconductor device according to a third embodiment.

A semiconductor device 300 according to the third embodiment includes a plurality of element arrays Ar1 to Arn and a plurality of transistors Tr1 to Trn.

Each of the plurality of element arrays Ar1 to Arn includes a plurality of the element portions 10 and a plurality of the quench portions 30. Each of the element portions 10 is directly connected to each of the quench portions 30. A pair of the single element portion 10 and the single quench portion 30 are connected in series, and a plurality of the pairs are connected in parallel, thus constituting each of the element arrays. The element portion 10 in the semiconductor device 300 has the same configuration as the element portion 10 in the semiconductor device 100 or 200, for example.

The plurality of transistors Tr1 to Trn are electrically connected respectively to the plurality of element arrays Ar1 to Arn. When one of the plurality of transistors Tr1 to Trn is selected, corresponding one of the plurality of element arrays Ar1 to Arn operates. A signal generated in one of the plurality of element arrays Ar1 to Arn is taken out from a terminal T via the selected one of the plurality of transistors Tr1 to Trn. The transistors Tr1 to Trn are examples of switching elements.

When a breakdown is repeated in the element portion 10, temperature repeatedly changes in the element portion 10 in consequence. In an elapse of service time of the semiconductor device 300, sensitivity of the element portion 10 may be lowered. For example, in the semiconductor device 300, one of the transistors is selected, and one of the element arrays is used. In use of the semiconductor device 300, when sensitivity of the element array is lowered, a different transistor is selected. Thus, a different element array without a decrease in sensitivity can be used to detect light. The third embodiment can prevent the sensitivity of the semiconductor device 300 from being degraded by use.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a photosensitive element:
        a first semiconductor region of a first conductivity type;
        a second semiconductor region of the first conductivity type on the first semiconductor region, an impurity concentration of the first conductivity type in the second semiconductor region being higher than that in the first semiconductor region;
        a third semiconductor region of a second conductivity type on the second semiconductor region; and
        a fourth semiconductor region of the second conductivity type around the second and third semiconductor regions, an impurity concentration of the second conductivity type in the fourth semiconductor region being lower than that of the third semiconductor region;
    an insulating region provided around the first and fourth semiconductor regions and in contact with the fourth semiconductor region; and
    a quench element electrically connected to the third semiconductor region.

2. The semiconductor device according to claim 1, wherein a lower end of the fourth semiconductor region is farther from a lower end of the first semiconductor region than is a lower end of the second semiconductor region.

3. The semiconductor device according to claim 1, wherein
    the photosensitive element further comprises:
        a fifth semiconductor region of the first conductivity type below the fourth semiconductor region and surrounding the first semiconductor region, and
        an impurity concentration of the first conductivity type in the fifth semiconductor region is higher than that in the first semiconductor region and lower than that in the second semiconductor region.

4. The semiconductor device according to claim 3, wherein
    the fifth semiconductor region is spaced from the fourth semiconductor region with the first semiconductor region therebetween, and
    a distance between an upper end of the fourth semiconductor region and a lower end of the fifth semiconductor region in a thickness direction of the semiconductor device is longer than 2.5 µm and shorter than 4 µm.

5. The semiconductor device according to claim 3, wherein a length of the fifth semiconductor region in a thickness direction of the semiconductor device is less than a length of the fourth semiconductor region in the thickness direction.

6. The semiconductor device according to claim 3, wherein a width of the fifth semiconductor region in a surface direction from the photosensitive element toward the insulating region is greater than 0.8 times a width of the fourth semiconductor region in the surface direction and less than 1.2 times the width of the fourth semiconductor region in the surface direction.

7. The semiconductor device according to claim 3, wherein the insulating region is in contact with the fifth semiconductor region.

8. The semiconductor device according to claim 1, wherein a thickness of the third semiconductor region in a thickness direction of the semiconductor device is greater than 0.5 μm and less than 1 μm.

9. The semiconductor device according to claim 1, wherein the insulating region is in contact with the first semiconductor region.

10. A photosensor, comprising:
   an array of photosensitive elements, each of the photosensitive elements comprising:
      a first semiconductor region of a first conductivity type;
      a second semiconductor region of the first conductivity type on the first semiconductor region, an impurity concentration of the first conductivity type in the second semiconductor region being higher than that in the first semiconductor region;
      a third semiconductor region of a second conductivity type on the second semiconductor region; and
      a fourth semiconductor region of the second conductivity type around the second and third semiconductor regions, an impurity concentration of the second conductivity type in the fourth semiconductor region being lower than that of the third semiconductor region;
   an insulating region provided around the first and fourth semiconductor regions of each of the photosensitive elements and in contact with the fourth semiconductor region of each of the photosensitive elements; and
   a plurality of quench elements electrically connected to the third semiconductor region of the photosensitive elements, respectively.

11. The photosensor according to claim 10, wherein the plurality of quench elements is above the insulating region.

12. The photosensor according to claim 10, wherein the array of photosensitive elements includes a first group of photosensitive elements connected in parallel to each other and a second group of photosensitive elements connected in parallel to each other.

13. The photosensor according to claim 12, further comprising:
   a first switching element connected in series to the first group of photosensitive elements; and
   a second switching element connected in series to the second group of photosensitive elements.

14. The photosensor according to claim 13, wherein the photosensor is configured to selectively turn on one, but not both, of the first and second switching elements.

15. The photosensor according to claim 14, wherein the photosensor is configured to turn on the first switching element, but not the second switching element, for a certain duration of time, and then turn on the second switching element, but not the first switching element.

16. The photosensor according to claim 13, wherein
   the array of photosensitive elements further includes a third group of photosensitive elements connected in parallel to each other, and
   the photosensor further includes a third switching element connected in series to the third group of photosensitive elements.

17. The photosensor according to claim 16, wherein the photosensor is configured to selectively turn on only one of the first, second, and third switching elements.

18. The photosensor according to claim 10, wherein
   each of the photosensitive elements further comprises:
      a fifth semiconductor region of the first conductivity type provided below the fourth semiconductor region and surrounding the first semiconductor region, and
      an impurity concentration of the first conductivity type in the fifth semiconductor region is higher than that in the first semiconductor region and lower than that in the second semiconductor region.

19. The photosensor according to claim 18, wherein the insulating region is in contact with the fifth semiconductor region of each of the photosensitive elements.

20. The photosensor according to claim 10, wherein the insulating region is in contact with the first semiconductor region of each of the photosensitive elements.

* * * * *